United States Patent
Mao

(10) Patent No.: US 12,143,102 B2
(45) Date of Patent: Nov. 12, 2024

(54) COUPLING-TYPE SINGLE-POLE DOUBLE-THROW SWITCH ADAPTED FOR RADIO FREQUENCY INTEGRATED CIRCUIT

(71) Applicant: Xi'an Creation Keji CO., Ltd., Xi'an (CN)

(72) Inventor: Yonggang Mao, Xi'an (CN)

(73) Assignee: XI'AN CREATION KEJI CO., LTD., Xi'an (CN)

( * ) Notice: Subject to any disclaimer, the term of this patent is extended or adjusted under 35 U.S.C. 154(b) by 19 days.

(21) Appl. No.: 17/256,842

(22) PCT Filed: Dec. 21, 2020

(86) PCT No.: PCT/CN2020/138114
§ 371 (c)(1),
(2) Date: Dec. 29, 2020

(87) PCT Pub. No.: WO2022/088445
PCT Pub. Date: May 5, 2022

(65) Prior Publication Data
US 2024/0259019 A1    Aug. 1, 2024

(30) Foreign Application Priority Data
Oct. 30, 2020    (CN) .......................... 202011197127.9

(51) Int. Cl.
*H03K 17/693*    (2006.01)
*H03K 17/51*    (2006.01)

(52) U.S. Cl.
CPC ..... *H03K 17/693* (2013.01); *H03K 2017/515* (2013.01)

(58) Field of Classification Search
CPC ...................... H03K 17/693; H03K 2017/515
See application file for complete search history.

(56) References Cited

FOREIGN PATENT DOCUMENTS

CN    106654469 B  *  6/2019  ................ H01P 1/18

* cited by examiner

*Primary Examiner* — Lincoln D Donovan
*Assistant Examiner* — James G Yeaman

(57) ABSTRACT

A coupling-type single-pole double-throw (SPDT) switch adapted for a radio frequency integrated circuit includes an input port, a first output port, a second output port, a multi-coupling-coil circuit and a transistor-based control circuit. The multi-coupling-coil circuit includes coils respectively connected with the input port, the first output port and the second output port. The transistor-based control circuit includes a first control circuit, a second control circuit and a third control circuit, and configured to control an input load of the multi-coupling-coil circuit using a control level of the first control circuit and realize connections between the input port and the first output port as well as the second output port using control levels of the second control circuit and the third control circuit. Therefore, the coupling-type SPDT switch can achieve a simple switching between two working states, and have low insertion loss and high isolation degree in both working states.

9 Claims, 2 Drawing Sheets

COUPLING-TYPE SINGLE-POLE DOUBLE-THROW SWITCH ADAPTED FOR RADIO FREQUENCY INTEGRATED CIRCUIT

TECHNICAL FIELD

The disclosure relates to the field of radio frequency integrated circuits technologies, and more particularly to a coupling-type single-pole double-throw (SPDT) switch adapted for a radio frequency integrated circuit.

DESCRIPTION OF RELATED ART

With the development of millimeter wave integrated circuits, switching devices are often used in radio frequency transceivers to control the switching between receiving and transmitting states in the millimeter wave integrated circuits. Insertion loss and isolation degree are important parameters/factors of a radio frequency integrated switch. It is usually necessary to design a switch with a low insertion loss and a high isolation degree.

However, today's millimeter wave integrated switches mostly use PIN diode switches or solid-state FET switches, and in order to achieve high isolation degree, a structure of multiple switches being connected in parallel is often used, however, the increase in the number of switches will cause excessively large insertion loss.

Therefore, it is an urgent need to provide a single-pole double-throw switch that can not only realize the switch between two working states, but also achieve the purpose of the low insertion loss and the high isolation degree.

SUMMARY

Accordingly, in order to solve the above problems in the prior art, embodiments of the disclosure provide a coupling-type single-pole double-throw switch adapted for a radio frequency integrated circuit. The technical problem of the disclosure to be solved is achieved by the following technical scheme:

Specifically, an embodiment of the disclosure provides a coupling-type single-pole double-throw switch adapted for a radio frequency integrated circuit including:

an input port, a first output port, a second output port, a multi-coupling-coil circuit and a transistor-based control circuit;

the multi-coupling-coil circuit includes coils electrically connected with the input port, the first output port and the second output port respectively;

the transistor-based control circuit includes a first control circuit, a second control circuit and a third control circuit, and configured to control an input load of the multi-coupling-coil circuit by using a control level of the first control circuit and realize connections between the input port and the first output port as well as the second output port by using control levels of the third control circuit and the second control circuit respectively.

In an embodiment of the disclosure, the coils of the multi-coupling-coil circuit include: a first coil, a second coil and a third coil; the first coil is disposed between the second coil and the third coil, an end of the first oil is electrically connected with the input port, the second coil is electrically connected with the first output port, and the third coil is electrically connected with the second output port.

In an embodiment of the disclosure, the first control circuit is electrically connected with another end of the first coil, the second control circuit is electrically connected between the second coil and an end of the third control circuit, and another end of the third control circuit is electrically connected with the third coil.

In an embodiment of the disclosure, further including:

a control port and inverters;

the control port is electrically connected with the third control circuit, and configured to provide the control level of the third control circuit;

the inverters are respectively connected between the control port and the second control circuit, and between the control port and the first control circuit; and the inverters are configured to provide the control levels of the second control circuit and the first control circuit after reversing a phase with 180 degrees of the control level provided by the control port.

In an embodiment of the disclosure, the first control circuit includes a first transistor, a first gate bias resistor, and a first external resistor electrically connected between a substrate and a source of the first transistor; the first gate bias resistor is electrically connected between a gate of the first transistor and the control port, a drain of the first transistor is electrically connected with the first coil, and the source of the first transistor is grounded, an end of the first external resistor is electrically connected with the substrate of the first transistor, and another end of the first external resistor is grounded.

In an embodiment of the disclosure, the second control circuit includes a second transistor, a second gate bias resistor and a second external resistor electrically connected between a substrate and a source of the second transistor; the second gate bias resistor is electrically connected between a gate of the second transistor and an output end of one of the inverters, a drain of the second transistor is electrically connected in parallel with the first output port, and the source of the second transistor is grounded, an end of the second external resistor is electrically connected with the substrate of the second transistor, and another end of the second external resistor is grounded.

In an embodiment of the disclosure, the third control circuit includes a third transistor, a third gate bias resistor and a third external resistor electrically connected between a substrate and a source of the third transistor; the third gate bias resistor is electrically connected between a gate of the third transistor and an input end of one of the inverters, and a drain of the third transistor is electrically connected in parallel with the second output port, and the source of the third transistor is grounded, an end of the third external resistor is connected to the substrate of the third transistor, and another end of the third external resistor is grounded.

In an embodiment of the disclosure, the third transistor is turned-off, and the second transistor as well as the first transistor are turned-on, when the control level provided by the control port is at a first level; so that the input port is electrically conducted with the second output port, but the input port is electrically unconducted with the first output port.

In an embodiment of the disclosure, the third transistor is turned-on, and the second transistor as well as the first transistor are turned-off, when the control level provided by the control port is at a second level; so that the input port is electrically unconducted with the second output port, but the input port is electrically conducted with the first output port.

In an embodiment of the disclosure, an application frequency range includes 30 Ghz~45 Ghz, and in the application frequency range, mismatch degrees of insertion loss between the input port and the first output port as well as the second output port each are less than 0.24 dB, insertion losses between the input port and the first output port as well as the second output port each are less than 1.87 dB, and isolation degrees between the input port and the first output port as well as the second output port each are greater than 23.2 dB.

The coupling-type single-pole double-throw switch adapted for the radio frequency integrated circuit of the embodiments of the disclosure, on the one hand, a working state of each control circuit is controlled by configuring a level signal of each control circuit, achieving electrical conductions between the input port and the first output port as well as the second output port, and therefore a switching between two working states can be easily achieved, and a freedom degree of design of the single-pole double-throw switch can be improved. On the other hand, the load switching technology is introduced at the input port to achieve the switching of different input loads according to different working states of the transistors in the first control circuit, thereby reducing the mismatch degrees between the input port and the first output port as well as the second output port, and achieving the lower insertion loss in the two working states. On the other hand, the isolation degrees between the input port and each output port can be improved by using the multi-coupling-coil circuit to isolate the input port, the first output port and the second output port.

Of course, it is not necessary to achieve all the advantages mentioned above at the same time to implement any product or method of the disclosure.

The disclosure will be further described in detail with reference to the attached drawings and embodiments.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protection scope of the disclosure.

In order to achieve a purpose of low insertion loss and high isolation degree, when a circuit is switched between two working states, the embodiment of the disclosure provides a coupling-type single-pole double-throw switch adapted for a radio frequency integrated circuit.

The embodiment of the disclosure provides a coupling-type single-pole double-throw (SPDT) switch adapted for a radio frequency integrated circuit. Next, the coupling-type single-pole double-throw switch will be introduced.

Figure 1:
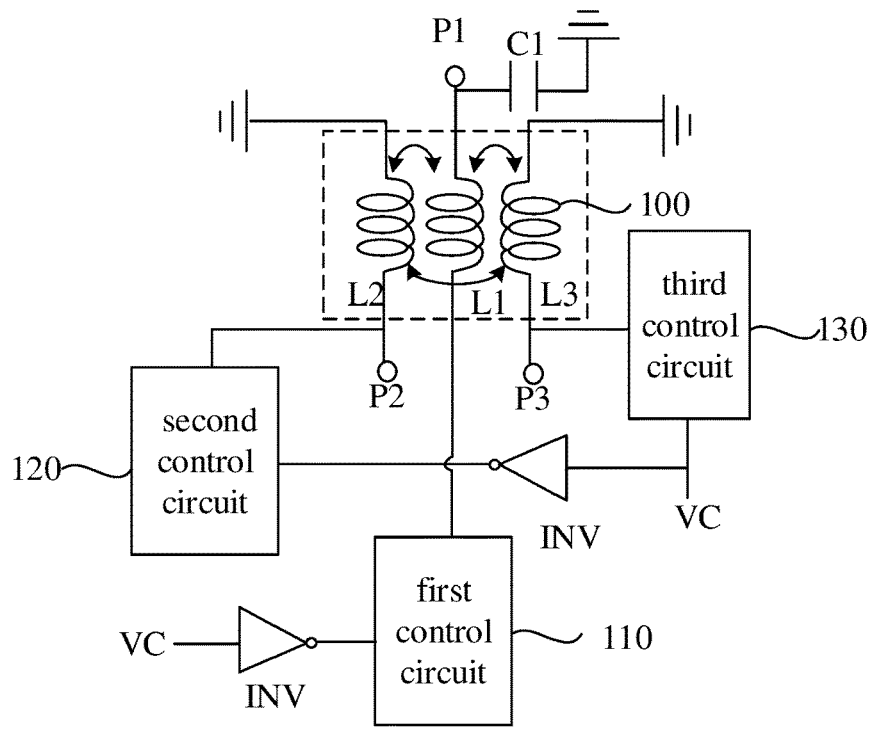
FIG. 1 is a schematic view of a circuit structure of a coupling-type single-pole double-throw switch adapted for a radio frequency integrated circuit according to an embodiment of the disclosure.

Referring to FIG. 1, FIG. 1 is a schematic view of a circuit structure of a coupling-type single-pole double-throw switch adapted for a radio frequency integrated circuit provided by an embodiment of the disclosure, including:

an input port P1, a first output port P2, a second output port P3, a multi-coupling-coil circuit 100 and a transistor-based control circuit.

The multi-coupling-coil circuit 100 includes coils electrically connected with the input port P1, the first output port P2 and the second output port P3 respectively.

It can be understood that, the multi-coupling-coil circuit 100 can isolate the input port P1, the first output port P2 and the second output port P3, and improve the isolation degree between the input port P1 and each output port, each output port such as each of the first output port P2 and the second output port P3.

The transistor-based control circuit includes: a first control circuit 110, a second control circuit 120 and a third control circuit 130. The transistor-based control circuit is configured to control an input load of the multi-coupling-coil circuit 100 by using a control level (e.g., control voltage level) of the first control circuit 110 and realize connections between the input port P1 and the first output port P2 as well as the second output port P3 by using control levels of the third control circuit 130 and the second control circuit 120.

It can be understood that, each control circuit is configured with a corresponding level signal (e.g., control voltage level), and different working states can be achieved under different level signals. According to the embodiment of the disclosure, the working state of each control circuit is controlled by configuring the level signal of each control circuit, so that the first output port P2 is electrically conducted with the input port P1 or the second output port P3 is electrically conducted with the input port P1, thereby the switching between the two working states can be easily achieved, and a design freedom of the single-pole double-throw switch can be improved. In addition, for the electrical conducting circuits corresponding to different output ports, load matching can be achieved by using the control level of the first control circuit 110 to correspondingly control an input load of the multi-coupling-coil circuit 100, thereby reducing the insertion loss of each electrical conducting circuit.

In addition, the λ/4 transmission line is usually used for the load matching in this field, but it needs a large layout area, which is not beneficial to on-chip integration. However, in the embodiment of the disclosure, the inductance coil and the control circuit are used to achieve the load matching, so the area can be reduced, which is beneficial to on-chip integration and achieves a miniaturized switch.

According to the coupling-type single-pole double-throw switch provided by the embodiment of the disclosure, the working state of each control circuit is controlled by configuring the level signal of each control circuit, achieving electrical conductions between the input port and the first output port as well as the second output port, therefore, the switching between the two working states can be easily achieved, and the freedom degree of design of the single-pole double-throw switch can be improved. In addition, the load switching technology is introduced at the input port to achieve the switching of different input loads according to different working states of the transistors in the first control circuit, thereby reducing the mismatch degrees between the input port and the first output port as well as the second output port, and achieving the lower insertion loss in the two working states, and the isolation degrees between the input port and each output port can be improved by using the multi-coupling-coil circuit to isolate the input port, the first output port and the second output port.

Figure 2:
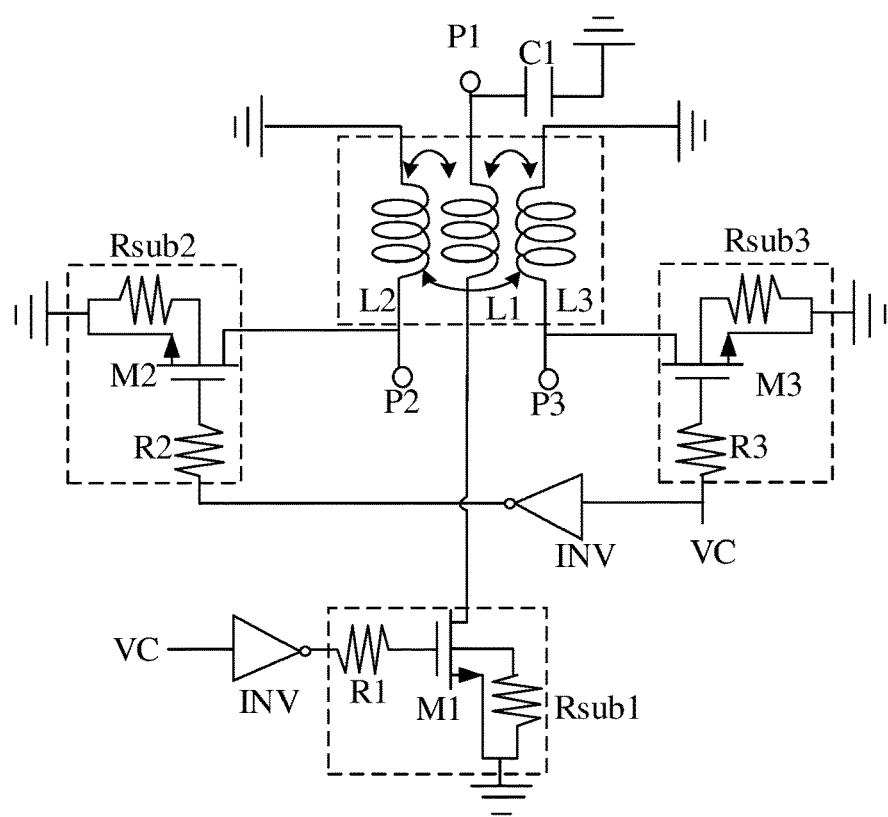
FIG. 2 is a schematic view of a detailed circuit structure of the coupling-type single-pole double-throw switch adapted for a radio frequency integrated circuit according to an embodiment of the disclosure.

An optional embodiment of a structure of the coupling-type single-pole double-throw switch provided by the embodiment of the disclosure will be described below. Please refer to FIG. 2 for details. FIG. 2 is a schematic view of a detailed circuit structure of the coupling-type single-pole double-throw switch adapted for a radio frequency integrated circuit according to an embodiment of the disclosure.

In an optional way, the multi-coupling-coil circuit 100 includes a first coil L1, a second coil L2 and a third coil L3, the first coil L1 is disposed between the second coil L2 and the third coil L3, an end of the first coil L1 is electrically connected with the input port P1, the second coil L2 is electrically connected with the first output port P2, and the third coil L3 is electrically connected with the second output port P3. The multi-coupling-coil circuit 100 can isolate the input port P1, the first output port P2 and the second output port P3, and improve the isolation degrees between the input port P1 and the first output port P2 as well as the second output port P3.

In an optional way, the first control circuit 110 is electrically connected with another end of the first coil L1, the second control circuit 120 is electrically connected between the second coil L2 and an end of the third control circuit 130, and another end of the third control circuit 130 is electrically connected with the third coil L3.

It can be understood that, the transistor-based control circuit can control the working state of the coupling-type single-pole double-throw switch according to the control level, that is, control the input port P1 electrically conducted with the first output port P2 and electrically unconducted with the second output port P3; Or, control the input port P1 electrically conducted with the second output port P3 and electrically unconducted with the first output port P2, so that the switching between the two working states can be easily achieved, and the freedom degree of design of the single-pole double-throw switch can be improved. At the same time, the load of the first coil L1 is controlled to reduce the mismatch degrees between the input port P1 and the first output port P2 as well as the second output port P3, that is, a difference between the insertion loss between the input port P1 and the first output port P2 and the insertion loss between the input port P1 and the second output port P3, so that the insertion losses of the two working states of electrical conductions between the input port P1 and the first output port P2 as well as the second output port P3 are low.

Optionally, the coupling-type single-pole double-throw switch of embodiment of the disclosure further includes: a control port VC and inverters INV.

The control port VC is electrically connected with the third control circuit 130, and configured to provide the control level of the third control circuit 130.

The inverters are respectively electrically connected between the control port VC and the second control circuit, and between the control port VC and the first control circuit, and configured to provide the control levels of the second control circuit and the first control circuit after reversing a phase with 180 degrees of the control level provided by the control port VC.

It should be noted that, the control ports VC in this embodiment are the same port, and for convenience of understanding, the control ports VC are indicated separately.

The inverters INV are configured to reverse the phase with 180 degrees of an input signal, that is, the control level of the control port VC is the control level of second control circuit 120 and the control level of first control circuit 110 reversed with 180 degrees.

Specifically, the inverters INV can be TTL inverters, CMOS inverters, etc. In this embodiment, TTL inverters are selected as the inverters.

Specifically, the control port VC directly provides the control level of the third control circuit 130, that is, the control level of the control port VC is equal to that of the third control circuit 110. After the phase of the control level provided by the control port VC is reversed with 180 degrees through the inverters INV to the second control circuit 120 and the first control circuit 110, so as to obtain the control levels of the second control circuit 120 and the first control circuit 110. That is, the control level of the third control circuit 130 is 180 degrees out of phase with the control levels of the second control circuit 120 and the first control circuit 110.

It can be understood that, the coupling-type single-pole double-throw switch provided in this embodiment further includes a bypass capacitor C1, an end of the bypass capacitor C1 is electrically connected with the first coil L1, and another end of the bypass capacitor C1 is grounded. It can be understood by those skilled in the art that the bypass capacitor can bypass and filter out the high-frequency components in the AC signal mixed with the high-frequency current and the low-frequency current, and can take the high-frequency noise in the signal of the input port P1 as a filtering object and filter out the high-frequency clutter carried by the previous stage.

The first control circuit includes, for example, a first transistor M1, a first gate bias resistor R1 and a first external resistor Rsub1 electrically connected between a substrate and a source of the first transistor M1. The first gate bias resistor R1 is electrically connected between a gate of the first transistor M1 and the control port VC, and a drain of the first transistor M1 is electrically connected with the first coil L1, and the source of the first transistor M1 is grounded, an end of the first external resistor Rsub1 is electrically connected with the substrate of the first transistor M1, and another end of the first external resistor Rsub1 is grounded.

The second control circuit includes, for example, a second transistor M2, a second gate bias resistor R2 and a second external resistor Rsub2 electrically connected between a substrate and a source of the second transistor. The second gate bias resistor R2 is electrically connected between a gate of the second transistor M2 and an output end of one of the inverters INV, a drain of the second transistor R2 is electrically connected in parallel with the first output port P2, and the source of the second transistor M2 is grounded, an end of the second external resistor Rsub2 is electrically connected with the substrate of the second transistor M2, and another end of the second external resistor Rsub2 is grounded.

The third control circuit includes, for example, a third transistor M3, a third gate bias resistor R3, and a third external resistor Rsub3 electrically connected between a substrate and a source of the third transistor. The third gate bias resistor R3 is electrically connected between a gate of the third transistor M3 and an input end of one of the inverters INV, and a drain of the third transistor M3 is electrically connected in parallel with the second output port P3, and the source of the third transistor M3 is grounded, an end of the third external resistor Rsub3 is electrically connected to the substrate of the third transistor M3, and another end of the third external resistor Rsub3 is grounded.

It should be noted that, the first gate bias resistor R1, the second gate bias resistor R2 and the third gate bias resistor R3 are configured to improve the isolation degrees between switching radio frequency signals and control signals.

The first external resistor Rsub1, the second external resistor Rsub2 and the third external resistor Rsub3 are configured to reduce the resistance of the substrate of the transistor connected with them, which can reduce the insertion loss.

Two working states of the coupling-type single-pole double-throw switch are described below, so as to facilitate understanding of the working principle of the coupling-type single-pole double-throw switch of the disclosure.

Figure 3:
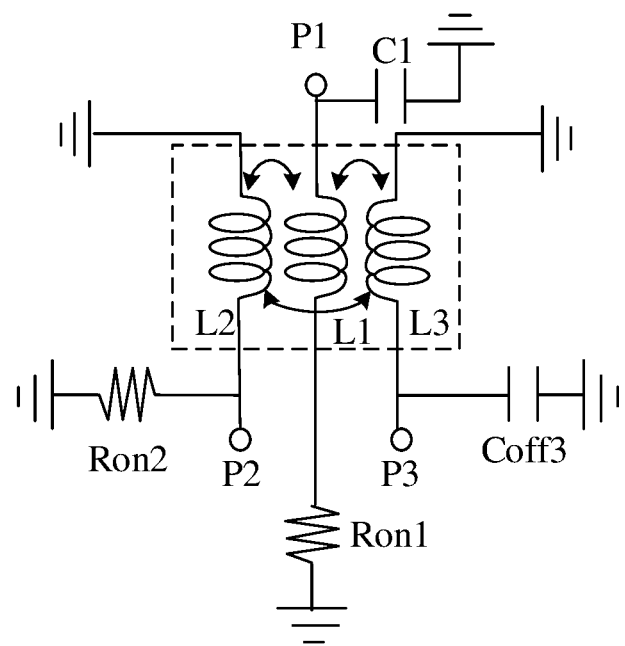
FIG. 3 is a schematic view of an equivalent circuit structure of the coupling-type single-pole double-throw switch adapted for a radio frequency integrated circuit at a first level according to an embodiment of the disclosure.

Referring to FIG. 3, FIG. 3 is a schematic view of an equivalent circuit structure of the coupling-type single-pole double-throw switch adapted for a radio frequency integrated circuit at a first level according to an embodiment of the disclosure.

In this embodiment, the third transistor M3 is turned-off, and the second transistor M2 as well as the first transistor M1 are turned-on, when the control level provided by the control port VC is at a first level, so that the input port P1 is electrically conducted with the second output port P3, but the input port P1 is electrically unconducted with the first output port P2.

The level signal is a signal represented by a level value, including a high level "1" and a low level "0".

In an optional embodiment:

A first level is a low level, such as 0. It is understood from FIG. 3 that the control level of the third control circuit 130 is also the low level because the control port VC provides the low level. it can be understood by those skilled in the art that according to the working principle of the transistor, the third transistor M3 is turned-off, and at this time, the third transistor M3 is equivalent to a transistor turn-off capacitor Coff3. under the action of the inverters IVN, the control level of the second control circuit 120 and the control level of the first control circuit 110 are high level. According to the working principle of the transistor, the second transistor M2 and the first transistor M1 are turned-on. At this time, the second transistor M2 is equivalent to a transistor on-resistance Ron2, the first transistor M1 is equivalent to a transistor on-resistance Ron1, and the third transistor M3 is equivalent to the transistor turn-off capacitor Coff3. Therefore, the input port P1 is electrically conducted with the second output port P3, and the transistor on-resistance Ron2 is equivalent to a load of the first output port P2. The transistor on-resistance Ron2 shorts the first output port P2 to the ground, so the input port P1 is electrically unconducted with the first output port P2. Therefore, parasitic capacitances of the second coil L2, the third coil L3 and the third transistor M3 are used as a load of the second output port P3.

Figure 4:
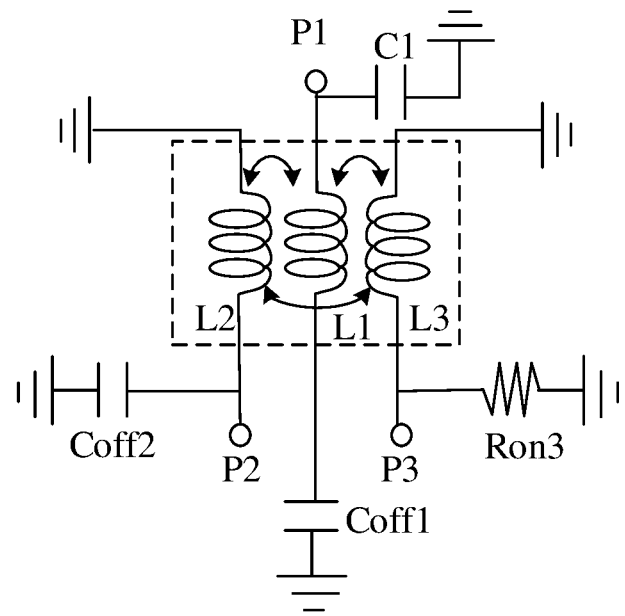
FIG. 4 is a schematic view of an equivalent circuit structure of the coupling-type single-pole double-throw switch adapted for a radio frequency integrated circuit at a second level according to an embodiment of the disclosure.

Referring to FIG. 4, FIG. 4 is a schematic view of an equivalent circuit structure of the coupling-type single-pole double-throw switch adopted for a radio frequency integrated circuit at a second level according to an embodiment of the disclosure.

In this embodiment, the control port VC provides the second level, the third transistor M3 is turned-on, and the second transistor M2 as well as the first transistor M1 are turned-off, when the control level provided by the control port VC is at the second level, so that the input port P1 is electrically unconducted with the second output port P3, but the input port P1 is electrically conducted with the first output port P2.

In an optional embodiment:

A second level is a high level, such as non-0. It is understood from FIG. 4 that the control level of the third control circuit 130 is also the high level because the control port VC provides the high level. it can be understood by those skilled in the art that according to the working principle of the transistor, the third transistor M3 is turned-on, and at this time, the third transistor M3 is equivalent to a transistor on-resistance Ron3. Under the action of the inverters IVN, the control level of the second control circuit 120 and the control level of the first control circuit 110 are the low level. According to the working principle of the transistor, the second transistor M2 and the first transistor M1 are turned-off. At this time, the second transistor M2 is equivalent to a transistor turn-off capacitor Coff2, the first transistor M1 is equivalent to a transistor turn-off capacitor Coff1, and the third transistor M3 is equivalent to the transistor on-resistance Ron3, the transistor on-resistance Ron3 shorts the second output port P3 to the ground. Therefore, the input port P1 is electrically unconducted with the second output port P3, and the transistor turn-off capacitor Coff2 is equivalent to a load of the first output port P2, so the input port P1 is electrically conducted with the first output port P2. Therefore, parasitic capacitances of the second coil L2, the third coil L3, the first transistor M1 and the second transistor M2 are used as the load of the first output port P2.

In this embodiment, using the working principle that the transistors are turned-on or turn-off at different levels, by controlling the control level of the control port, the transistor in the first control circuit is provided with the same control level as the control port, and the inverters are configured to provide the control level opposite to the control port for the transistor in the second control circuit and the transistor in the third control circuit, so the switching between the two working states can be easily achieved, and the freedom degree of design of the single-pole double-throw switch can be improved. At the same time, the load switching technology is introduced at the input port to achieve the switching of different input loads according to different working states of the transistors in the first control circuit, and achieve the lower insertion loss in the two working states.

In addition, the coupling-type single-pole double-throw switch provided by the embodiment of the disclosure can improve the isolation degrees between the switch radio frequency signals and the control signals according to the gate bias resistance of the transistor-based control circuit, reduce the resistance of the substrate of the transistor according to the external resistance, achieve the purpose of reducing the insertion loss, further ensure that the single-pole double-throw switch has smaller insertion loss and higher isolation degree performance in the two working states, and achieve good matching between the input port and the two output ports of the millimeter-wave integrated circuit switch.

In order to verify the working effect of the coupling-type single-pole double-throw switch adapted for the radio frequency integrated circuit provided by the embodiment of the disclosure, the specific parameters of the coupling-type single-pole double-throw switch will be described below.

In an optional embodiment, a first transistor M1 consists of six groups of field effect transistors, and each group of field effect transistors includes 48 channels, with a channel width of 1 μm, and a channel length of 40 nm. A second transistor M2 consists of six groups of field effect transistors, and each group of field effect transistors includes 48 channels, with a channel width of 1 μm and a channel length of 40 nm. A third transistor M3 consists of 9 groups of field effect transistors, and each group of field effect transistors includes 48 channels, with a channel width of 1 μm, and a channel length of 40 nm.

The resistance values of a first gate bias resistor R1, a second gate bias resistor R2 and a third gate bias resistor R3 are all 3 KΩ.

The resistance values of a first external resistor Rsub1, a second external resistor Rsub2 and a third external resistor Rsub3 are all 6 KΩ, and the capacitance of a bypass capacitor C1 is 40 fF.

According to the above structural parameters, the coupling-type single-pole double-throw switch can achieve that an application frequency range includes 30 GHz~45 GHz. In the application frequency range, mismatch degrees of insertion loss between the input port P1 and the first output port P2 as well as the second output port P3 each are less than 0.24 dB, insertion losses between the input port P1 and the first output port P2 as well as the second output port P3 each are less than 1.87 dB, and isolation degrees between the input port P1 and the first output port P2 as well as the second output port P3 each are greater than 23.2 dB.

It can be understood that, the application frequency range selected in this simulation is 30 GHz~45 GHz, because this frequency range is the main application frequency range of the 5G communication at present.

It should be noted that, the structural parameters in coupling-type single-pole double-throw switch provided by the embodiment of the disclosure are not limited to this, and those skilled in the art can think that structures with different parameters can achieve the same effect according to different use conditions.

It should be noted that the terms "first" and "second" in the description and claims of the disclosure and the above drawings are used to distinguish similar objects, rather than to limit a specific order or sequence. It should be understood that the terms used in this way can be interchanged under appropriate circumstances so that the embodiments of the disclosure described herein can be implemented in an order other than those illustrated or described herein. In addition, the terms "including" and "having" and any variations thereof are intended to cover non-exclusive inclusions, for example, a process, method, system, product, or device containing a series of steps or units need not be limited to the clearly listed step(s) or unit(s), but may include other step(s) or unit(s) not explicitly listed or inherent to the process, method, system, product, or device.

All the embodiments in this specification are described in a related way, and the same and similar parts among the embodiments can be referred to each other. Each embodiment focuses on the differences from other embodiments. Especially, for the system embodiment, because it is basically similar to the method embodiment, the description is relatively simple, and relevant points can be found in the partial description of the method embodiment.

It is understood that the foregoing embodiments are only exemplary descriptions of the disclosure. On the premise that the technical features are not in conflict, the structures are not contradictory and the purpose of the disclosure is not violated, the technical solutions of various embodiment can be arbitrarily combined and used together.

Finally, it should be noted that the above embodiments are only used to illustrate the technical solutions of the invention, rather than to limit the invention. Although the invention has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the invention.

What is claimed is:

1. A coupling-type single-pole double-throw (SPDT) switch adapted for a radio frequency integrated circuit, comprising:
    an input port, a first output port, a second output port, a multi-coupling-coil circuit, and a transistor-based control circuit;
    wherein the multi-coupling-coil circuit comprises coils electrically connected with the input port, the first output port and the second output port respectively;
    wherein the transistor-based control circuit comprises a first control circuit, a second control circuit and a third control circuit, and configured to control an input load of the multi-coupling-coil circuit by using a control level of the first control circuit and realize connections between the input port and the first output port as well as the second output port by using control levels of the third control circuit and the second control circuit respectively;
    wherein the coupling-type SPDT switch further comprises: a control port, and inverters;
    wherein the control port is electrically connected with the third control circuit and configured to provide the control level of the third control circuit;
    wherein the inverters are respectively connected between the control port and the second control circuit, and between the control port and the first control circuit; and the inverters are configured to provide the control levels of the second control circuit and the first control circuit after reversing a phase with 180 degrees of the control level provided by the control port.

2. The coupling-type SPDT switch as claimed in claim 1, wherein the coils of the multi-coupling-coil circuit comprise: a first coil, a second coil and a third coil; the first coil is disposed between the second coil and the third coil, an end of the first oil is electrically connected with the input port, the second coil is electrically connected with the first output port, and the third coil is electrically connected with the second output port.

3. The coupling-type SPTD switch as claimed in claim 2, wherein the first control circuit is electrically connected with another end of the first coil, the second control circuit is electrically connected between the second coil and an end of the third control circuit, and another end of the third control circuit is electrically connected with the third coil.

4. The coupling-type SPDT switch as claimed in claim 1, wherein the first control circuit comprises a first transistor, a first gate bias resistor, and a first external resistor electrically connected between a substrate and a source of the first transistor; the first gate bias resistor is electrically connected between a gate of the first transistor and the control port, a drain of the first transistor is electrically connected with the first coil, and the source of the first transistor is grounded; an end of the first external resistor is electrically connected with the substrate of the first transistor, and another end of the first external resistor is grounded.

5. The coupling-type SPDT switch as claimed in claim 1, wherein the second control circuit comprises a second transistor, a second gate bias resistor, and a second external resistor electrically connected between a substrate and a source of the second transistor; the second gate bias resistor is electrically connected between a gate of the second transistor and an output end of one of the inverters, a drain of the second transistor is electrically connected in parallel with the first output port, and the source of the second transistor is grounded; an end of the second external resistor is electrically connected with the substrate of the second transistor, and another end of the second external resistor is grounded.

6. The coupling-type SPDT switch as claimed in claim 1, wherein the third control circuit comprises a third transistor, a third gate bias resistor, and a third external resistor electrically connected between a substrate and a source of the third transistor; the third gate bias resistor is electrically connected between a gate of the third transistor and an input end of one of the inverters, a drain of the third transistor is electrically connected in parallel with the second output port, and the source of the third transistor is grounded; an end of the third external resistor is electrically connected to the substrate of the third transistor, and another end of the third external resistor is grounded.

7. The coupling-type SPDT switch as claimed in claim 6, wherein the third transistor is turned-off, and the second transistor as well as the first transistor are turned-on, when the control level provided by the control port is at a first level; so that the input port is electrically conducted with the second output port, but the input port is electrically unconducted with the first output port.

8. The coupling-type SPDT switch as claimed in claim 6, wherein the third transistor is turned-on, and the second transistor as well as the first transistor are turned-off, when the control level provided by the control port is at a second level; so that the input port is electrically unconducted with the second output port, but the input port is electrically conducted with the first output port.

9. The coupling-type SPDT switch as claimed in claim 1, wherein an application frequency range comprises 30 Ghz~45 Ghz, and in the application frequency range, mismatch degrees of insertion loss between the input port and the first output port as well as the second output port each are less than 0.24 dB, insertion losses between the input port and the first output port as well as the second output port each are less than 1.87 dB, and isolation degrees between the input port and the first output port as well as the second output port each are greater than 23.2 dB.

* * * * *